(12) United States Patent
Guo et al.

(10) Patent No.: US 9,565,441 B2
(45) Date of Patent: *Feb. 7, 2017

(54) METHOD AND APPARATUS FOR QUANTIZATION LEVEL CLIPPING

(71) Applicant: HFI INNOVATION INC., Zhubei, Hsinchu County (TW)

(72) Inventors: Xun Guo, Beijing (CN); Shaw-Min Lei, Zhubei (TW)

(73) Assignee: HFI INNOVATION INC., Zhubei, Hsinchu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/079,341

(22) Filed: Mar. 24, 2016

(65) Prior Publication Data

US 2016/0205401 A1 Jul. 14, 2016

Related U.S. Application Data

(62) Division of application No. 13/985,779, filed as application No. PCT/CN2012/086648 on Dec. 14, 2012.

(30) Foreign Application Priority Data

Dec. 15, 2011 (WO) ................ PCT/CN2011/084083

(51) Int. Cl.
*H04N 11/02* (2006.01)
*H04N 19/124* (2014.01)
(Continued)

(52) U.S. Cl.
CPC ......... *H04N 19/124* (2014.11); *H03M 7/3059* (2013.01); *H04N 19/126* (2014.11);
(Continued)

(58) Field of Classification Search
USPC ........................ 375/240.01–240.29
See application file for complete search history.

(56) References Cited

U.S. PATENT DOCUMENTS 5,832,130 A 11/1998 Kim
5,923,787 A * 7/1999 Hara ................ G06T 9/005
358/426.14

(Continued)

FOREIGN PATENT DOCUMENTS

CN 1150740 5/1998
CN 102271258 12/2011
(Continued)

OTHER PUBLICATIONS

Li, X., et al.; "Clipping of Transformed Coefficients before Dequantization," Joint Collaborative Team on Video Coding (JCT-VC) of ITU-T SG16 WP3 and ISO/IEC JTC1/SC29/WG11; Feb. 2012; pp. 1-3.

(Continued)

*Primary Examiner* — Leron Beck
(74) *Attorney, Agent, or Firm* — McClure, Qualey & Rodack, LLP

(57) ABSTRACT

A method and apparatus for clipping a transform coefficient are disclosed. In one implementation, a method is implemented in a video encoder for clipping a quantization level. The method operates by generating the quantization level for a transform coefficient of a transform unit by quantizing the transform coefficient according to a quantization matrix and quantization parameter, determining a clipping condition in the video encoder based on video source bit-depth, and clipping the quantization level according to the clipping condition to generate a clipping-processed quantization level.

12 Claims, 1 Drawing Sheet

(51) Int. Cl.
*H04N 19/126* (2014.01)
*H04N 19/136* (2014.01)
*H04N 19/60* (2014.01)
*H03M 7/30* (2006.01)
*H04N 19/132* (2014.01)
*H04N 19/146* (2014.01)
*H04N 19/18* (2014.01)
*H04N 19/44* (2014.01)

(52) U.S. Cl.
CPC ......... *H04N 19/132* (2014.11); *H04N 19/136* (2014.11); *H04N 19/146* (2014.11); *H04N 19/18* (2014.11); *H04N 19/60* (2014.11); *H04N 19/44* (2014.11)

(56) References Cited

U.S. PATENT DOCUMENTS

| | | | | |
|---|---|---|---|---|
| 6,898,323 | B2* | 5/2005 | Schwartz | G11B 27/036 375/E7.045 |
| 7,660,355 | B2* | 2/2010 | Winger | H03M 7/4006 341/51 |
| 7,778,813 | B2* | 8/2010 | Zhou | H04N 19/176 703/15 |
| 2002/0118743 | A1 | 8/2002 | Jiang | |
| 2002/0150157 | A1* | 10/2002 | Lin | H04N 19/105 375/240.2 |
| 2003/0105788 | A1* | 6/2003 | Chatterjee | H04N 19/61 708/402 |
| 2004/0146106 | A1* | 7/2004 | De Lameillieure | H03M 7/30 375/240.12 |
| 2005/0013357 | A1* | 1/2005 | Cheong | H04N 19/176 375/240.01 |
| 2005/0036545 | A1 | 2/2005 | Zhou | |
| 2006/0171456 | A1* | 8/2006 | Kwon | H04N 19/197 375/240.03 |
| 2007/0065023 | A1* | 3/2007 | Lee | H04N 19/176 382/232 |
| 2007/0189626 | A1 | 8/2007 | Tanizawa et al. | |
| 2007/0299897 | A1* | 12/2007 | Reznik | G06F 17/147 708/409 |
| 2011/0194614 | A1* | 8/2011 | Norkin | H04N 19/176 375/240.24 |
| 2012/0328004 | A1* | 12/2012 | Coban | H04N 19/105 375/240.03 |
| 2015/0215620 | A1 | 7/2015 | Alshina et al. | |
| 2016/0191936 | A1 | 6/2016 | Suzuki et al. | |

FOREIGN PATENT DOCUMENTS

| | | |
|---|---|---|
| EP | 2 278 874 | 5/2014 |
| RU | 2 350 041 | 3/2009 |
| RU | 2014 102 989 | 8/2015 |
| WO | WO 2011/043793 | 4/2011 |

OTHER PUBLICATIONS

Kerofsky, L., et al., "Limiting Dynamic Range when Using a Quantization Weighing Matrix," Joint Collaborative Team on Video Coding (JCT-VC) of ITU-T SG16 WP3 and ISO/IEC JTC1/SC29/WG11; Jul. 2011; pp. 1-5.

Alshin, A.; "About Clip Operation Removal from De-quantization Part of HM;" Joint Collaborative Team on Video Coding (JCT-VC) of ITU-T SG16 WP3 and ISO/IEC JTC1/SC29/WG11; Jul. 2011; pp. 1-5.

* cited by examiner

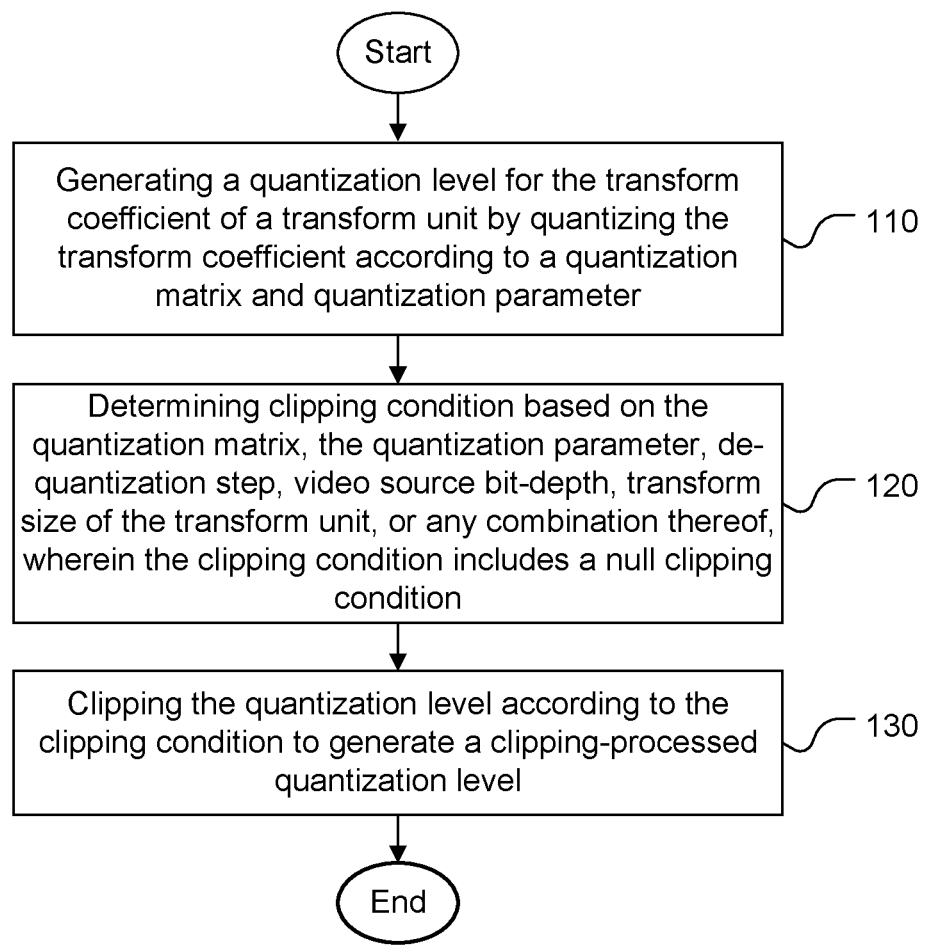

METHOD AND APPARATUS FOR QUANTIZATION LEVEL CLIPPING

CROSS REFERENCE TO RELATED APPLICATIONS

The present invention is a Divisional of pending U.S. application Ser. No. 13/985,779, filed on Aug. 15, 2013, which is a National Stage of PCT Patent Application, Serial No. PCT/CN2012/086648, filed on Dec. 14, 2012, entitled "Method of Clipping Transformed Coefficients before De-Quantization," which claims priority to PCT Patent Application Ser. No. PCT/CN2011/084083, filed on Dec. 15, 2011. The priority applications are hereby incorporated by reference in their entirety.

FIELD OF THE INVENTION

The present invention relates to video coding. In particular, the present invention relates to quantization level clipping for High Efficiency Video Coding (HEVC).

BACKGROUND AND RELATED ART

High-Efficiency Video Coding (HEVC) is a new international video coding standard that is being developed by the Joint Collaborative Team on Video Coding (JCT-VC). HEVC is based on the hybrid block-based motion-compensated DCT-like transform coding architecture. The basic unit for compression, termed Coding Unit (CU), is a 2N×2N square block, and each CU can be recursively split into four smaller CUs until a predefined minimum size is reached. Each CU contains one or several variable-block-sized Prediction Unit(s) (PUs) and Transform Unit(s) (TUs). For each PU, either intra-picture or inter-picture prediction is selected. Each TU is processed by a spatial block transform and the transform coefficients for the TU are then quantized. The smallest TU size allowed for HEVC is 4×4.

The quantization of transform coefficients plays an important role in bitrate and quality control in video coding. A set of quantization steps is used to quantize the transform coefficient into a quantization level. A larger quantization step size will result in lower bitrate and lower quality. On the other hand, a smaller quantization step size will result in higher bitrate and higher quality. A straightforward implementation of the quantization process would involve a division operation which is more complex in hardware-based implementation and consumes more computational resource in software-based implementation. Accordingly, various techniques have been developed in the field for division-free quantization process. In HEVC Test Model Revision 5 (HM-5.0), the quantization process is described as follows. A set of parameters are defined:

B=bit width or bit depth of the input source video,
DB=B−8,
N=transform size of the transform unit (TU),
M=log 2(N),
Q[x]=f(x), where f(x)={26214,23302,20560,18396,16384,14564}, x=0, . . . , 5, and
IQ[x]=g(x), where g(x)={40,45,51,57,64,72}, x=0, . . . , 5.
Q[x] and IQ[x] are called quantization step and dequantization step respectively. The quantization process is performed according to:

$$q\text{level} = (\text{coeff} * Q[QP\%6] + \text{offset}) >> (21 + QP/6 - M - DB), \text{ where}$$

$$\text{offset} = 1 << (20 + QP/6 - M - DB), \quad (1)$$

where "%" is the modulo operator. The dequantization process is performed according to:

$$\text{coeffQ} = ((q\text{level} * IQ[QP\%6] << (QP/6)) + \text{offset}) >> (M-1+DB), \text{ where}$$

$$\text{offset} = 1 << (M-2+DB). \quad (2)$$

The variable qlevel in equations (1) and (2) represents the quantization level of a transform coefficient. The variable coeffQ in equation (2) represents the dequantized transform coefficient. IQ[x] indicates de-quantization step (also called de-quantization step size) and QP represents the quantization parameter. "QP/6" in equations (1) and (2) represents the integer part of QP divided by 6. As shown in equations (1) and (2), the quantization and dequantization processes are implemented by integer multiplication followed by arithmetic shift(s). An offset value is added in both equations (1) and (2) to implement integer conversion using rounding.

The bit depth of the quantization level is 16 bits (including 1 bit for sign) for HEVC. In other words, the quantization level is represented in 2 bytes or a 16-bit word. Since $IQ(x) \leq 72$ and $QP \leq 51$, the dynamic range of IQ[x] is 7 bits and the "<<(QP/6)" operation performs left arithmetic shift up to 8 bits. Accordingly, the dynamic range of de-quantized transform coefficient coeffQ, i.e., "(qlevel*IQ[QP %6])<<(QP/6)", is 31 (16+7+8) bits. Therefore, the de-quantization process as described by equation (2) will never cause overflow since the de-quantization process uses 32-bit data representation.

However, when quantization matrix is introduced, the de-quantization process is modified as shown in equations (3) through (5):

$$i\text{Shift} = M - 1 + DB + 4. \quad (3)$$

if $(i\text{Shift} > QP/6)$, $$\text{coeffQ}[i][j] = (q\text{level}[i][j] * W[i][j] * IQ[QP\%6] + \text{offset}) >> (i\text{Shift} - QP/6), \text{ where}$$

$$\text{offset} = 1 << (i\text{Shift} - QP/6 - 1), \text{ with } i=0 \ldots nW-1, j=0 \ldots nH-1 \quad (4)$$

else $$\text{coeffQ}[i][j] = (q\text{level}[i][j] * W[i][j] * IQ[QP\%6]) << (QP/6 - i\text{Shift}) \quad (5)$$

wherein "[i][j]" indicates the position (also called indices) of the transformed coefficient within a transform unit, W denotes quantization matrix, nW and nH are width and height of the transform. If n represents the dynamic range of a quantization level for a transform coefficient, the dynamic range n has to satisfy the following condition to avoid overflow:

$$n + w + iq + QP/6 - M + DB - 3 \leq 32, \quad (6)$$

where w is the dynamic range of quantization matrix W, iq is the dynamic range of IQ[x] and the bit depth of the de-quantized or reconstructed transform coefficient is 32 bits.

If the dynamic range of the quantization matrix W is 8 bits, the dynamic range of the reconstructed transform coefficient as described by equations (3) through (5) becomes 34 (16+8+7+3) bits for QP=51, M=2 and DB=0. When the de-quantization process uses 32-bit data representation, the reconstructed transform coefficient according to equation equations (3) through (5) may overflow and cause system failure. Therefore it is desirable to develop a scheme for transform coefficient reconstruction to avoid possible overflow.

BRIEF SUMMARY OF THE INVENTION

A method and apparatus for clipping a quantization level are disclosed. Embodiments according to the present invention avoid overflow of the quantized transform coefficient by clipping the quantization level adaptively after quantization. In one embodiment of the present invention, the method comprises generating the quantization level for the transform coefficient of a transform unit by quantizing the transform coefficient according to a quantization matrix and quantization parameter; determining clipping condition based on video source bit-depth; and clipping the quantization level according to the clipping condition to generate a clipping-processed quantization level.

BRIEF DESCRIPTION OF THE DRAWINGS

FIG. 1 illustrates an exemplary flow chart for clipping a transform coefficient incorporating an embodiment of the present invention to avoid overflow.

DETAILED DESCRIPTION OF THE INVENTION

As mentioned before, the coefficient de-quantization (or reconstruction) process as described above may suffer from overflow when quantization matrix is incorporated. To avoid potential overflow during transform coefficient reconstruction, embodiments according to the present invention restrict the quantization level of the transform coefficient before performing the de-quantization process. The dynamic range of the quantization level of the transform coefficient is represented by an integer n. In the example as described in equations (3) to (5), the dynamic range of n shall not exceed 32 bits if 32-bit data representation is used for the de-quantized (or reconstructed) transform coefficients. Accordingly, n has to satisfy the following constraint:

$$n+8+7+(QP/6-(M-1+DB+4)) \leq 32, \quad (7)$$

which leads to $$n \leq 20+M+DB-QP/6. \quad (8)$$

In this case, the quantization level, qlevel, of the transform coefficient shall be clipped according to equation (9):

$$q\text{level}=\max(-2^{n-1},\min(2^{n-1}-1,q\text{level})) \quad (9)$$

To avoid the overflow, the dynamic range of the quantization level of the transform coefficient has to be constrained according to equation (8). According to equation (8), n has to be less than or equal to (20+M+DB−QP/6) to avoid overflow. However, since the quantization level is represented by 16 bits in this example, (i.e., the bit depth of the quantization level=16), n should not exceed 16 bits. Accordingly, if (20+M+DB−QP/6) is greater than 16, the quantization level of the transform coefficient has to be clipped to a range not to exceed 16-bit data representation. The following pseudo codes (pseudo code A) illustrate an example of clipping the quantization level, qlevel, of the transform coefficient according to an embodiment of the present invention in order to avoid data overflow during transform coefficient reconstruction:

```
Pseudo code A:
   if (20+M+DB−QP/6 >= 16)
      qlevel = max( −2^15, min(2^15 −1, qlevel));
   else
      qlevel = max( −2^{20+M+DB−QP/6 −1}, min (2^{20+M+DB−QP/6 −1} −1, qlevel)).
```

As shown in pseudo code A, two clipping ranges are used for two different clipping conditions. The first clipping condition corresponds to "20+M+B−8−QP/6≥16" and the second clipping condition corresponds to "20+M+B−8−QP/6<16". The first clipping range corresponds to a fixed clipping range, i.e., $(-2^{15}, 2^{15}-1)$ and the second clipping range corresponds to $(-2^{20+M+DB-QP/6-1}, 2^{20+M+DB-QP/6-1})$. While the test condition "if (20+M+DB−QP/6≥16)" is used in the exemplary pseudo code A shown above, other test conditions may also be used. For example, the test condition may use the bit depth B of the video source instead of parameter DB. The test condition becomes "if (20+M+B−8−QP/6>=16)", i.e., "if (12+M+B−QP/6>=16)". The corresponding pseudo codes (Pseudo code B) becomes:

```
Pseudo code B:
   if (12+M+B−QP/6 >= 16)
      qlevel = max( −2^15, min(2^15 −1, qlevel));
   else
      qlevel = max( −2^{12+M+B−QP/6 −1}, min(2^{12+M+B−QP/6 −1} −1, qlevel)).
```

If the bit-depth of source video is 8 bits (DB=0) and the transform size is 4×4, equation (8) can be simplified to:

$$n \leq 22-QP/6. \quad (9)$$

Therefore, the test condition "if (12+M+B−QP/6≥16)" becomes "if (22−QP/6≥16)" in this case. The test condition can be further simplified as "if (QP<=36)". Consequently, clipping process for the quantization level of the transform coefficient according to another embodiment of the present invention only depends on QP for video source with fixed dynamic range. An exemplary pseudo codes (Pseudo code C) is shown below:

```
Pseudo code C:
   if (QP<=36)
      qlevel = max( −2^15, min(2^15 −1, qlevel));
   else
      qlevel = max( −2^{21−QP/6}, min(2^{21−QP/6} −1, qlevel)).
```

When the bit-depth of source video is 10 bits or higher, i.e., DB≥2, the condition in (7) is always met. In this case, 16-bit clipping, namely qlevel=max(−2^15, min(2^15−1, qlevel)) or qlevel=max(−32,768, min(32,767, qlevel)), is always used unconditionally. While the clipping is performed unconditional for the bit-depth equal to 10 bits or higher, the quantization level of the transform coefficient may also be clipped unconditionally to desired bit-depth regardless of the bit-depth of the source video. The desired bit-depth can be 8, 16 or 32 bits and the corresponding clipping ranges can be [−128, 127], [−32768, 32767] and [−2147483648, 2147483647].

Three exemplary pseudo codes incorporating an embodiment of the present invention are described above. These pseudo codes are intended to illustrate exemplary process to avoid data overflow during transform coefficient reconstruction. A person skilled in the art may practice the present invention by using other test conditions. For example, instead of testing "if (QP<=36)", the test condition "if (QP/6<=6)" may be used. In another example, the clipping operation may be implemented by using other function such as a clipping function, clip (x, y, z), where the variable z is clipped between x and y (x<y). The clipping operations for pseudo code C can be expressed as:

$q\text{level}=\text{clip}(-2^{15},2^{15}-1,q\text{level})$, and $q\text{level}=\text{clip}(-2^{21-QP/6},2^{21-QP/6}-1,q\text{level})$.

In the above examples, specific parameters are used to illustrate the dequantization process incorporating embodiments of the present invention to avoid data overflow. The specific parameters used shall not be construed as limitations to the present invention. A person skilled in the art may modify the testing for clipping condition based on the parameters provided. For example, if de-quantization step has 6-bit dynamic range instead of 7-bit dynamic range, the constraint of equation (8) becomes n≤19+M+DB−QP/6. The corresponding clipping condition testing in pseudo code A becomes "if (19+M+DB−QP/6>=16)".

While the above quantization level clipping process is performed for the decoder side, the quantization level clipping process can also be performed in the encoder side after quantization. To avoid potential overflow, embodiments according to the present invention restrict the quantization level of the transform coefficient after performing the quantization process. The clipping condition may be based on the quantization matrix, the quantization parameter, de-quantization step, video source bit-depth, transform size of the transform unit, or any combination thereof. The clipping condition may also include a null clipping condition, where no clipping condition is set. In other words, the null condition corresponds to unconditional clipping that always clips the quantization level to a range. In an embodiment, the quantization level can be clipped to a first range for a first clipping condition and the quantization level can be clipped to a second range for a second clipping condition. The first range may correspond to a fixed range related to quantization-level bit-depth and the second range may be related to dynamic range of the quantization level. The clipping condition can be determined by comparing a first weighted value with a threshold, wherein the first weighted value corresponds to a first linear function of the quantization matrix, the quantization parameter, the video source bit-depth, the transform size of the transform unit, or any combination thereof. Furthermore, the threshold may correspond to a fixed value or a second weighted value, wherein the second weighted value corresponds to a second linear function of the quantization matrix, the quantization parameter, the video source bit-depth, the transform size of the transform unit, or any combination thereof.

The quantization level of the transform coefficient may also be clipped unconditionally to a desired bit-depth regardless of the bit-depth of source video. The desired bit-depth can be 8, 16 or 32 bits and the corresponding clipping ranges can be [−128, 127], [−32768, 32767] and [−2147483648, 2147483647].

FIG. 1 illustrates an exemplary flow chart of clipping a quantization level for a video encoder incorporating an embodiment of the present invention to avoid overflow. A quantization level is generated for the transform coefficient of a transform unit by quantizing the transform coefficient according to a quantization matrix and quantization parameter in step 110. A clipping condition is determined based on the quantization matrix, the quantization parameter, de-quantization step, video source bit-depth, transform size of the transform unit, or any combination thereof in step 120, wherein the clipping condition includes a null clipping condition. The quantization level is then clipped according to the clipping condition to generate a clipping-processed quantization level in step 130.

The flow chart in FIG. 1 is intended to illustrate an example of quantization level clipping for a video encoder to avoid overflow of the quantization level. A skilled person in the art may practice the present invention by re-arranging the steps, split one or more steps, or combining one or more steps.

The above description is presented to enable a person of ordinary skill in the art to practice the present invention as provided in the context of a particular application and its requirement. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed. In the above detailed description, various specific details are illustrated in order to provide a thorough understanding of the present invention. Nevertheless, it will be understood by those skilled in the art how the present invention may be practiced.

Embodiment of the present invention as described above may be implemented in various hardware, software codes, or a combination of both. For example, an embodiment of the present invention can be a circuit integrated into a video compression chip or program code integrated into video compression software to perform the processing described herein. An embodiment of the present invention may also be program code to be executed on a Digital Signal Processor (DSP) to perform the processing described herein. The invention may also involve a number of functions to be performed by a computer processor, a digital signal processor, a microprocessor, or field programmable gate array (FPGA). These processors can be configured to perform particular tasks according to the invention, by executing machine-readable software code or firmware code that defines the particular methods embodied by the invention. The software code or firmware code may be developed in different programming languages and different formats or styles. The software code may also be compiled for different target platforms. However, different code formats, styles and languages of software codes and other means of configuring code to perform the tasks in accordance with the invention will not depart from the spirit and scope of the invention.

The invention may be embodied in other specific forms without departing from its spirit or essential characteristics. The described examples are to be considered in all respects only as illustrative and not restrictive. The scope of the invention is therefore, indicated by the appended claims rather than by the foregoing description. All changes which come within the meaning and range of equivalency of the claims are to be embraced within their scope.

The invention claimed is:

1. A method implemented in a video encoder for clipping a quantization level, the method comprising:
   generating the quantization level for a transform coefficient of a transform unit by quantizing the transform coefficient according to a quantization matrix and quantization parameter;
   determining a clipping condition in the video encoder based on video source bit-depth; and
   clipping the quantization level according to the clipping condition to generate a clipping-processed quantization level, wherein the quantization level is clipped to a first range from −m to m−1 for a first clipping condition and the quantization level is clipped to a second range for a second clipping condition, wherein m corresponds to 128, 32768, or 2147483648.

2. The method of claim 1, wherein the clipped quantization level is represented in n bits for the first clipping condition.

3. The method of claim 2, wherein n corresponds to 8, 16, or 32.

4. The method of claim 1, wherein the clipping condition is determined as the first clipping condition when the video source bit-depth is 10 bits or higher.

5. The method of claim 1, wherein the second range is related to dynamic range of the quantization level.

6. The method of claim 1, wherein the clipping condition is determined by comparing a first weighted value with a threshold, wherein the first weighted value corresponds to a first linear function of the video source bit-depth.

7. The method of claim 6, wherein the threshold corresponds to a fixed value or a second weighted value, wherein the second weighted value corresponds to a second linear function of the video source bit-depth.

8. A video encoding apparatus for clipping a quantization level, the apparatus comprising at least one circuit configured to:

generate the quantization level for a transform coefficient of a transform unit by quantizing the transform coefficient according to a quantization matrix and quantization parameter;

determine a clipping condition in the video encoding apparatus based on video source bit-depth; and clip the quantization level according to the clipping condition to generate a clipping-processed quantization level, wherein the quantization level is clipped to a first range from −m to m−1 for a first clipping condition and the quantization level is clipped to a second range for a second clipping condition, wherein m corresponds to 128, 32768, or 2147483648.

9. The apparatus of claim 8, wherein the clipping condition is determined as the first clipping condition when the video source bit-depth is 10 bits or higher.

10. The apparatus of claim 8, wherein the second range is related to dynamic range of the quantization level.

11. The apparatus of claim 7, wherein the clipping condition is determined by comparing a first weighted value with a threshold, wherein the first weighted value corresponds to a first linear function of the video source bit-depth.

12. The apparatus of claim 11, wherein the threshold corresponds to a fixed value or a second weighted value, wherein the second weighted value corresponds to a second linear function of the video source bit-depth.

* * * * *